(12) United States Patent
Huang et al.

(10) Patent No.: US 10,504,724 B2
(45) Date of Patent: Dec. 10, 2019

(54) SELECTIVE FILM GROWTH FOR BOTTOM-UP GAP FILLING

(71) Applicant: Taiwan Semiconductor Manufacturing Company, Ltd., Hsinchu (TW)

(72) Inventors: Yu-Lien Huang, Jhubei (TW); De-Wei Yu, Ping-tung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/203,204

(22) Filed: Nov. 28, 2018

(65) Prior Publication Data

US 2019/0109004 A1     Apr. 11, 2019

Related U.S. Application Data

(62) Division of application No. 15/814,581, filed on Nov. 16, 2017, now Pat. No. 10,170,305.

(60) Provisional application No. 62/552,005, filed on Aug. 30, 2017.

(51) Int. Cl.
| | | |
|---|---|---|
| *H01L 29/165* | (2006.01) | |
| *H01L 21/02* | (2006.01) | |
| *H01L 21/3065* | (2006.01) | |
| *H01L 21/027* | (2006.01) | |
| *H01L 29/06* | (2006.01) | |
| *H01L 29/78* | (2006.01) | |
| *H01L 21/306* | (2006.01) | |
| *H01L 29/66* | (2006.01) | |
| *H01L 21/265* | (2006.01) | |
| *H01L 21/762* | (2006.01) | |
| *H01L 21/3105* | (2006.01) | |

(52) U.S. Cl.
CPC .... *H01L 21/02645* (2013.01); *H01L 21/0245* (2013.01); *H01L 21/0262* (2013.01); *H01L 21/0273* (2013.01); *H01L 21/02507* (2013.01); *H01L 21/02532* (2013.01); *H01L 21/02639* (2013.01); *H01L 21/3065* (2013.01); *H01L 21/30604* (2013.01); *H01L 29/0649* (2013.01); *H01L 29/165* (2013.01); *H01L 29/66795* (2013.01); *H01L 29/7851* (2013.01); *H01L 21/26513* (2013.01); *H01L 21/31053* (2013.01); *H01L 21/76224* (2013.01)

(58) Field of Classification Search
CPC ............... H01L 29/0649; H01L 29/165; H01L 29/7851; H01L 29/66795
See application file for complete search history.

(56) References Cited

U.S. PATENT DOCUMENTS

| | | |
|---|---|---|
| 4,847,214 A | 7/1989 | Robb et al. |
| 2015/0037970 A1 | 2/2015 | Hasebe et al. |
| 2015/0318176 A1 | 11/2015 | Qi et al. |

*Primary Examiner* — Douglas M Menz
(74) *Attorney, Agent, or Firm* — Slater Matsil, LLP

(57) ABSTRACT

A method includes etching a portion of a semiconductor material between isolation regions to form a trench, forming a semiconductor seed layer extending on a bottom surface and sidewalls of the trench, etching-back the first semiconductor seed layer until a top surface of the semiconductor seed layer is lower than top surfaces of the isolation regions, performing a selective epitaxy to grow a semiconductor region from the semiconductor seed layer, and forming an additional semiconductor region over the semiconductor region to fill the trench.

20 Claims, 29 Drawing Sheets

SELECTIVE FILM GROWTH FOR BOTTOM-UP GAP FILLING

PRIORITY CLAIM AND CROSS-REFERENCE

This application is a divisional of U.S. patent application Ser. No. 15/814,581, entitled "Selective Film Growth for Bottom-Up Gap Filling," and filed Nov. 16, 2017, which claims the benefit of the following provisionally filed U.S. patent application: Application Ser. No. 62/552,005, filed Aug. 30, 2017, and entitled "Selective Film Growth for Bottom-Up Gap Filling," which applications are hereby incorporated herein by reference.

BACKGROUND

The formation of fin field-effect transistors involves the formation of recesses, and then filling the recesses with a semiconductor material in order to form semiconductor fins. For example, recesses may be formed between shallow trench isolation regions, and silicon germanium is grown in the recesses. With the increasingly down-scaling of the integrated circuits, the aspect ratio of the recesses becomes increasingly higher. This causes the difficulty in filling the recesses. As a result, voids and seams may occur in the semiconductor material that is filled in the recesses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 23A illustrate the cross-sectional views of intermediate stages in the formation of a semiconductor fin and a Fin Field-Effect Transistor (FinFET) in accordance with some embodiments of the present disclosure.

DETAILED DESCRIPTION

Figure 1:
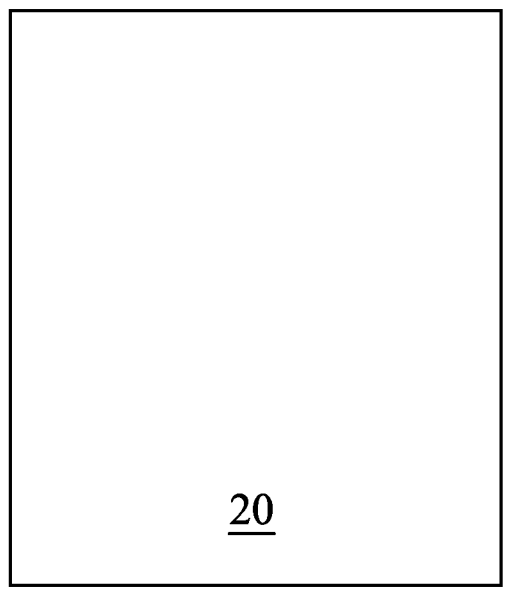

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bottom-up gap-filling method and the Fin Field-Effect Transistors (FinFETs) formed based on the semiconductor material filling the gaps are provided in accordance with various exemplary embodiments. The intermediate stages of the gap-filling and the formation of FinFETs are illustrated in accordance with some embodiments. Some variations of some embodiments are discussed. Throughout the various views and illustrative embodiments, like reference numbers are used to designate like elements. It is appreciated that in the illustrative embodiments, germanium and silicon are used as examples to discuss the concept of the present disclosure, while other semiconductor materials such as silicon carbon, III-V compound semiconductors, or the like may also be used.

FIGS. 1 through 23A illustrate the cross-sectional views of intermediate stages in the formation of a FinFET in accordance with some embodiments of the present disclosure. The steps shown in FIGS. 1 through 23A are also reflected schematically in the process flow shown in FIG. 24.

FIG. 1 illustrates a cross-sectional view of substrate 20, which is a part of a semiconductor wafer. Substrate 20 may be a semiconductor substrate such as a silicon substrate, a silicon carbon substrate, a silicon-on-insulator substrate, or a substrate formed of other semiconductor materials. Substrate 20 may also include other semiconductor materials such as silicon germanium, III-V compound semiconductor materials. Substrate 20 may be lightly doped with a p-type or an n-type impurity.

Figure 2:
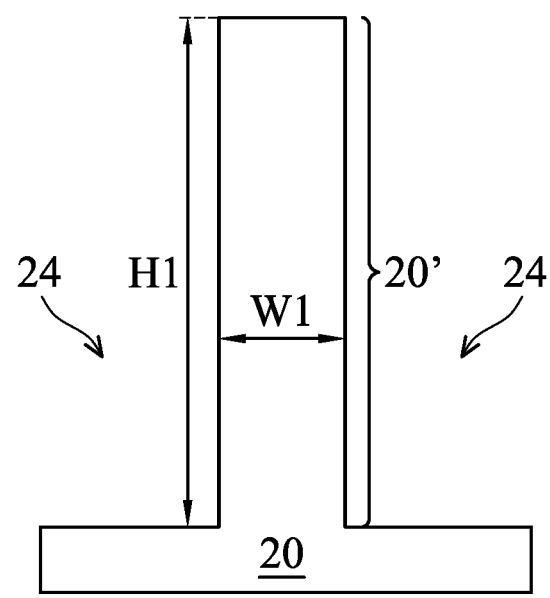

FIG. 2 illustrates the formation of trenches 24. In accordance with some embodiments of the present disclosure, a pad oxide layer and a hard mask layer (not shown) are formed over substrate 20, and are then patterned. In accordance with some embodiments of the present disclosure, the pad oxide is formed of silicon oxide, which may be formed by oxidizing a top surface portion of semiconductor substrate 20. The hard mask may be formed of silicon nitride, silicon oxynitride, carbo-nitride, or the like. The patterned hard mask and pad oxide layer are used as an etching mask to etch substrate 20, so that trenches 24 are formed.

Trenches 24 extend into semiconductor substrate 20, and have lengthwise directions parallel to each other. Although two trenches 24 are illustrated, there may be a plurality of trenches, such as 5, 10, or more trenches formed, which are parallel to each other. Trenches 24 may have equal length and equal pitch. Semiconductor substrate 20 has remaining portions between neighboring trenches 24, and the remaining portions are referred to substrate portions 20' hereinafter. Although one substrate portion 20' is illustrated for simplicity, there may be a plurality of substrate portions 20', which may have a uniform pitch and a uniform width. In accordance with some embodiments of the present disclosure, height H1 of substrate portion 20' is in the range between about 30 nm and about 120 nm. Width W1 of substrate portion 20' may be in the range between about 5 nm and about 20 nm. It is appreciated that the values recited throughout the description are examples, and different values may also be adopted without changing the principle of the present disclosure.

Figure 3:
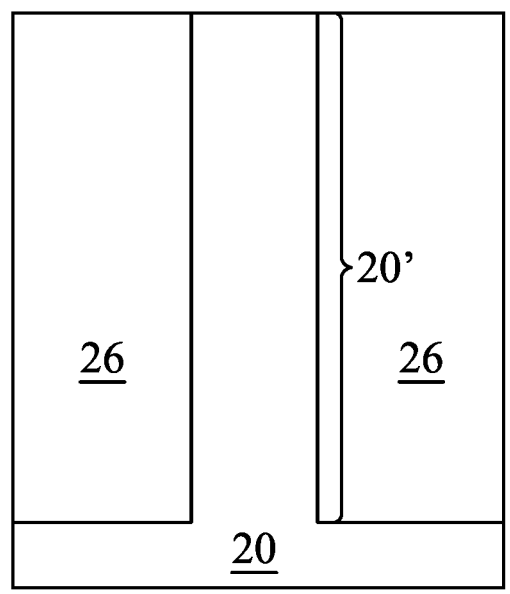

Next, as shown in FIG. 3, isolation regions 26, which are alternatively referred to as Shallow Trench Isolation (STI) regions 26, are formed in trenches 24 (FIG. 2). The respective process step is illustrated as step 202 in the process flow 200 as shown in FIG. 24. The formation of STI regions 26 may include forming a dielectric liner (not shown separately) in trenches 24, with the dielectric liner being formed on the exposed surfaces of semiconductor substrate 20, and filling remaining trenches 24 with a dielectric material(s). The dielectric liner may be a silicon oxide layer formed through thermal oxidation, so that a surface layer of the semiconductor substrate 20 is oxidized to form a silicon oxide. The remaining trenches 24 may be filled using Flowable Chemical Vapor Deposition (FCVD), spin-on coating, or the like. A planarization step such as Chemical-Mechanical Polish (CMP) or mechanical grinding is then performed to level the top surface of the filled dielectric material with the top surface of the hard mask (not shown). After the CMP, the hard mask is removed. Alternatively, the polish stops on the top surfaces of STI regions 26. In a top view of the structure shown in FIG. 3, each substrate portion 20' may be an elongated strip (which has a uniform width) encircled by the respective STI regions 26, or may be a strip with the opposite ends connected to bulk portions of semiconductor substrate 20.

An anneal process may be performed. In accordance with some exemplary embodiments of the present disclosure, the anneal is performed in an oxygen-containing environment. The annealing temperature may be higher than about 200° C., for example, in a temperature range between about 200° C. and about 700° C. During the anneal, an oxygen-containing process gas is conducted into the process chamber in which the wafer is placed. The oxygen-containing process gas may include oxygen ($O_2$), ozone ($O_3$), or combinations thereof. Steam ($H_2O$) may also be used. The steam may be used without oxygen ($O_2$) or ozone, or may be used in combination with oxygen ($O_2$) and/or ozone.

Figure 4:
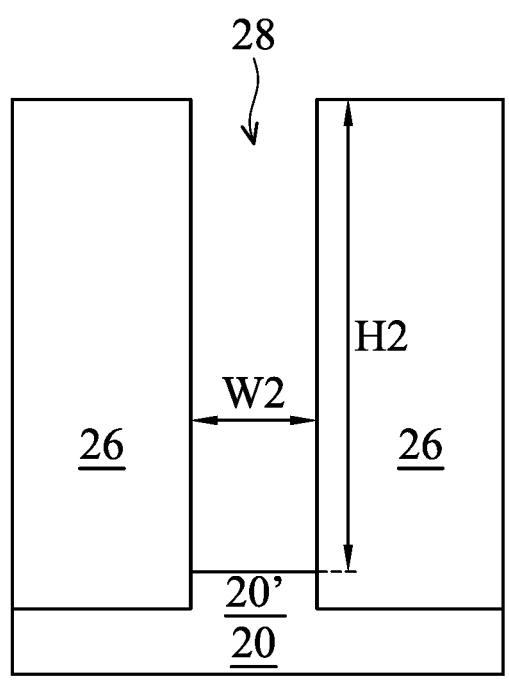

Referring to FIG. 4, substrate portion 20' is recessed, forming trench 28 between neighboring STI regions 26. The respective process step is illustrated as step 204 in the process flow 200 as shown in FIG. 24. In accordance with some embodiments of the present disclosure, the etching is performed through dry etching. The etching gas may include a mixture of HBr, $Cl_2$, and $O_2$, or a fluorine-containing gas such as $CF_2$, $C_2F_6$, $CF_4$, NF3, $SF_6$ or the like. The etching may also be performing using wet etch, and the etchant may include KOH, tetramethylammonium hydroxide (TMAH), $HF/HNO_3/H_2O$ (a mixture), $CH_3COOH$, $NH_4OH$, $H_2O_2$, or Isopropanol (IPA). In accordance with some embodiments of the present disclosure, the bottom of trench 28 is higher than the bottom surfaces of STI regions 26. In accordance with alternative embodiments of the present disclosure, the bottom of trench 28 is substantially level with the bottom surfaces of STI regions 22. Height H2 of trench 28 may be in the range between about 20 nm and about 100 nm. Width W2 of trench 28 may be in the range between about 5 nm and about 20 nm. The aspect ratio of trench 28 is greater than about 4, and may be in the range between about 4 and about 20.

A well implantation may be performed to implant an n-type impurity or a p-type impurity into substrate 20 to form a well region, which extends to a level lower than bottom surfaces of STI regions 26. The conductivity type of the dopant introduced in the well implantation is opposite to the conductivity type of the subsequently formed FinFET. For example, when a p-type FinFET (with p-type source/drain regions) is to be formed, the well implantation includes implanting an n-type impurity such as phosphorus or arsenic. When an n-type FinFET (with n-type source/drain regions) is to be formed, the well implantation includes implanting a p-type impurity such as boron or indium. A further anneal may be performed after the well implantation.

Figure 5:
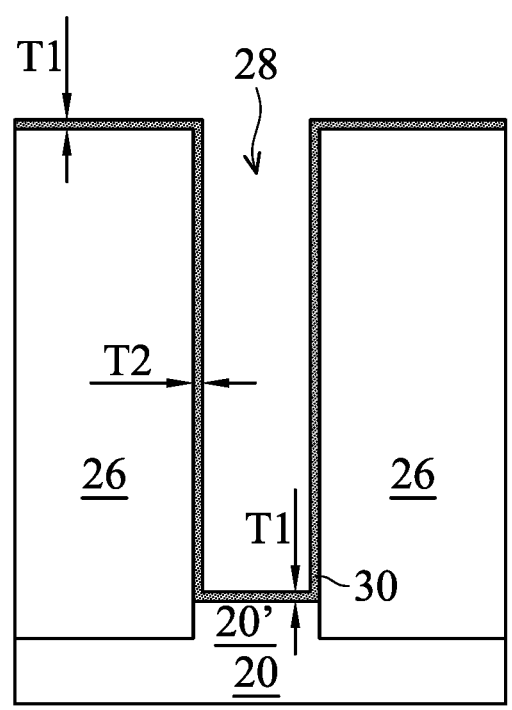

Referring to FIG. 5, semiconductor seed layer 30 is deposited through epitaxy. The respective process step is illustrated as step 206 in the process flow 200 as shown in FIG. 24. The temperature for the deposition is selected, so that at least the portion of seed layer directly deposited on the exposed surface of substrate portion 20' is grown through epitaxy. In accordance with some embodiments of the present disclosure, the temperature of the deposition is in the range between about 350° C. and about 700°.

The deposition of semiconductor seed layer 30 is nonselective, and hence semiconductor seed layer 30 is formed on both the exposed top surface of the remaining substrate portion 20' and the sidewalls and the top surfaces of STI regions 26. Semiconductor seed layer 30 is formed as a conformal layer, and is formed using a conformal deposition method such as Atomic Layer Deposition (ALD) or Chemical Vapor Deposition (CVD). For example, the thickness T1 of the horizontal portions and thickness T2 of the vertical portions of semiconductor seed layer 30 may have a difference smaller than about 20 percent or smaller than about 10 percent of either one of thicknesses T1 and T2.

Figure 23A:
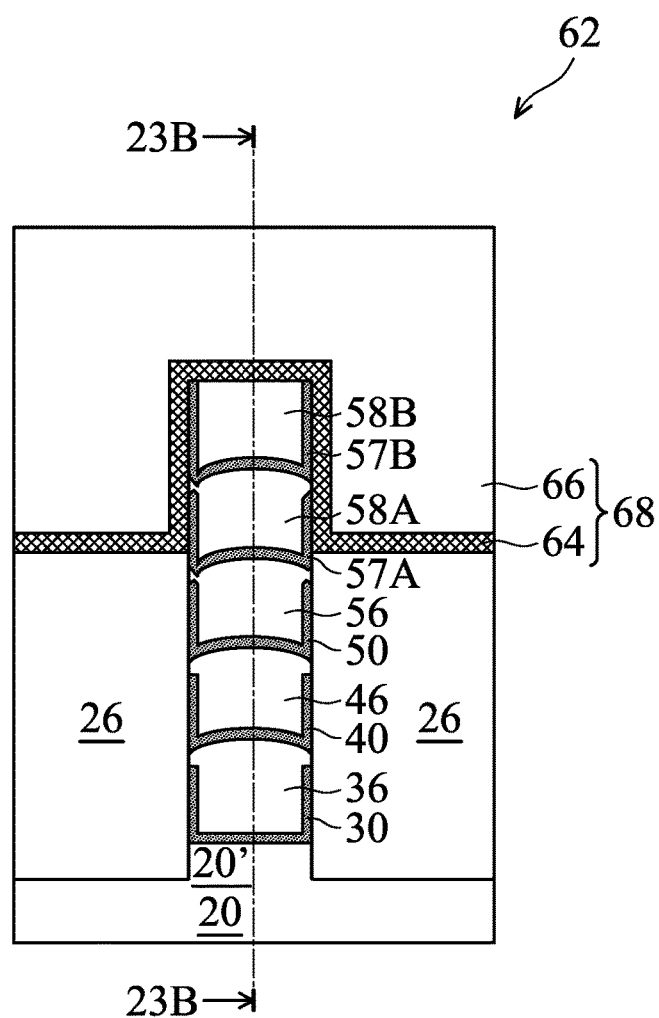

The precursor for forming semiconductor seed layer 30 may include a silicon-containing precursor such as $SiH_4$, $Si_2H_6$, $Si_2Cl_6$, $Si_2H_4Cl_2$, the mixture thereof, or the like if seed layer 30 includes silicon. The precursor may include a germanium-containing precursor such as $GeH_4$, $Ge_2H_6$, the mixture thereof, or the like if seed layer 30 includes germanium. When seed layer 30 includes SiGe, the precursor may include both a silicon-containing precursor (as discussed above) and a germanium-containing precursor (as discussed above). The pressure of the process gas for the deposition may be in the range between about 0.15 Torr and about 30 Torr. In accordance with some embodiments of the present disclosure, semiconductor seed layer 30 is a silicon layer free from germanium. In accordance with alternative embodiments of the present disclosure, semiconductor seed layer 30 is a silicon germanium layer. In accordance with yet alternative embodiments of the present disclosure, semiconductor seed layer 30 is a germanium layer free from silicon. The material of semiconductor seed layer 30 is affected by the desirable material of semiconductor fin 60 as shown in FIG. 23A. The germanium percentage in seed layer 30 may be equal to or lower than the germanium percentage in semiconductor fin 60, and may be equal to or higher than the germanium percentage in substrate 20. Semiconductor seed layer 30 may have a thickness in the range between about 1 nm and about 5 nm. In accordance with alternative embodiments, seed layer 30 is formed of another semiconductor material such as silicon carbon, a III-V compound semiconductor material, or the like.

Figure 6:
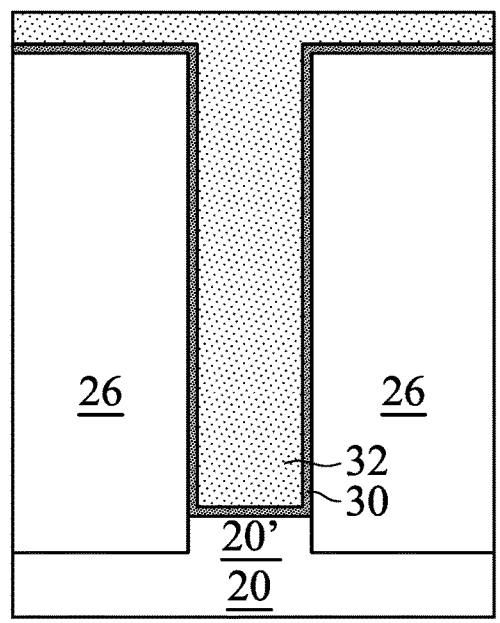

After the deposition of semiconductor seed layer 30, protection layer 32 (FIG. 6) is formed to fill the remaining portion of trench 28. The respective process step is illustrated as step 208 in the process flow 200 as shown in FIG. 24. The resulting structure is shown in FIG. 6. In accordance with some embodiments of the present disclosure, protection layer 32 is formed of a photo resist. In accordance with alternative embodiments, protection layer 32 is formed of another material that is different from the material of STI regions 26. For example, protection layer 32 may be formed of an inorganic material such as a spin-on glass, silicon nitride, silicon carbide, or an organic material (which may be a polymer) such as polyimide or polybenzoxazole (PB0). The property of protection layer 32 is different from that of STI regions 26, so that in the subsequent etching of semiconductor seed layer 30, STI regions 26 are not damaged. Protection layer 32 may have a substantially planar top surface, which may be caused by spin-on coating when protection layer 32 is formed of a photo resist, a polymer, or a spin-on dielectric material. In accordance with some embodiments, when the top surface of protection layer 32 is not planar as-formed, a planarization step such as CMP or mechanical grinding is performed. The planarization may be stopped at any time before semiconductor seed layer 30 is exposed. The planarization may also be stopped using semiconductor seed layer 30 or STI regions 26 as a stop layer. The top surface of the resulting protection layer 32 may thus be higher than, lower than, or level with, the top surface of STI regions 26, and may be higher than, lower than, or level with, the top surface of seed layer 30.

Figure 7:
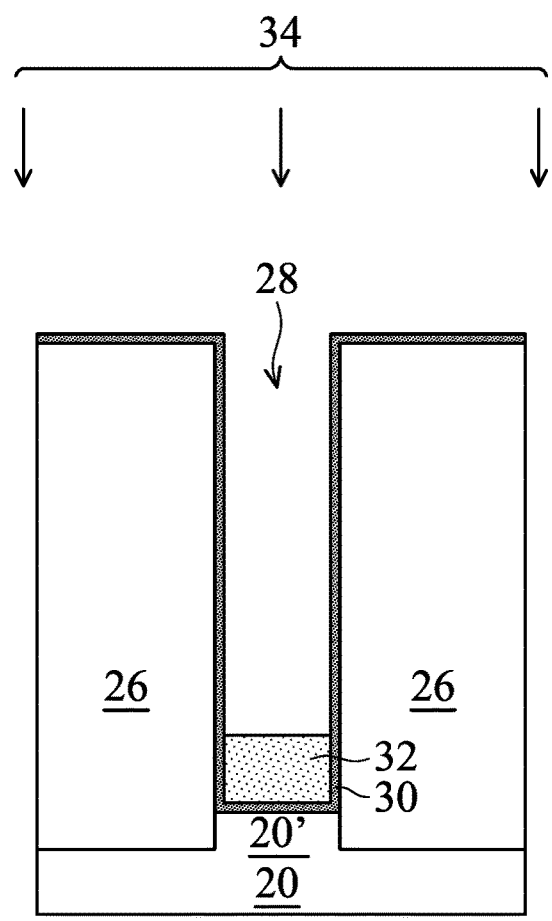

FIG. 7 illustrates the etch-back of protection layer 32. The etch-back is symbolized by arrows 34. The respective process step is illustrated as step 210 in the process flow 200 as shown in FIG. 24. The etch-back may include a dry etch and/or a wet etch. Furthermore, the etch-back may be isotropic or anisotropic. In accordance with some embodiments of the present disclosure, the etch-back is performed using an etchant that attacks protection layer 32, but doesn't attack semiconductor seed layer 30 and STI regions 26. As a result of the etch-back of protection layer 32, the remaining protection layer 32 is recessed to occupy a bottom portion of trench 28. The top surface of the remaining protection layer 32 may be substantially planar or slightly curved.

Figure 8:
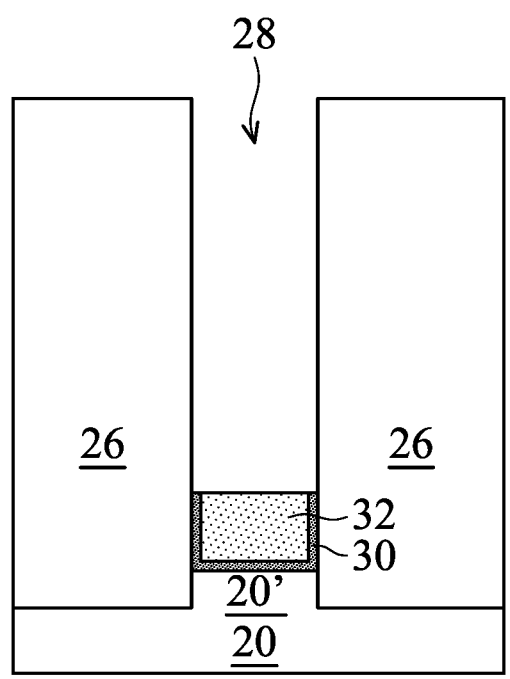

FIG. 8 illustrates the etching-back of semiconductor seed layer 30. The respective process step is illustrated as step 212 in the process flow 200 as shown in FIG. 24. In accordance with some embodiments of the present disclosure, the etch-back of semiconductor seed layer 30 is performed through a wet etch using ammonia solution (HN$_4$OH) when seed layer 30 includes silicon. In accordance with alternative embodiments of the present disclosure, the etch-back is performed through a dry etch using a fluorine-containing gas such as CF$_4$, CHF$_3$, CH$_2$F$_2$, or the like. In the etching, due to the protection of protection layer 32, the bottom portions of semiconductor seed layer 30 between protection layer 32 and STI regions 26 are not etched. The top portions of semiconductor seed layer 30 are removed in the etching, and the resulting structure is shown in FIG. 8.

In accordance with alternative embodiments of the present disclosure, instead of etching protection layer 32 and semiconductor seed layer 30 in separate steps, both protection layer 32 and semiconductor seed layer 30 are etched in a common etching step using the same etchant. Since semiconductor seed layer 30 is thin, keeping the etching selectivity moderate (not too high) is able to achieve the simultaneous etching of protection layer 32 and semiconductor seed layer 30. The etching selectivity is the ratio of the etching rate of protection layer 32 to the etching rate of semiconductor seed layer 30. For example, depending on the materials of semiconductor seed layer 30 and protection layer 32, a mixture of two etching gases may be used, with one etching gas used for etching semiconductor seed layer 30, and the other etching gas used for etching protection layer 32. In accordance with other embodiments, a single etching gas or etching solution that attacks both semiconductor seed layer 30 and protection layer 32 is used.

Figure 9:
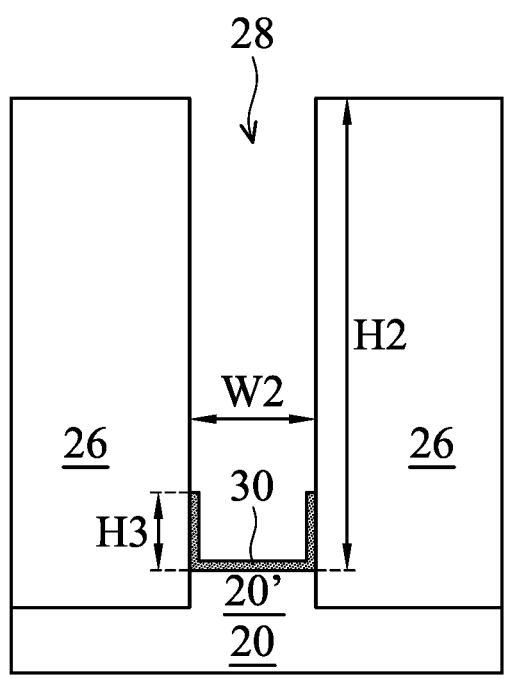
Figure 10:
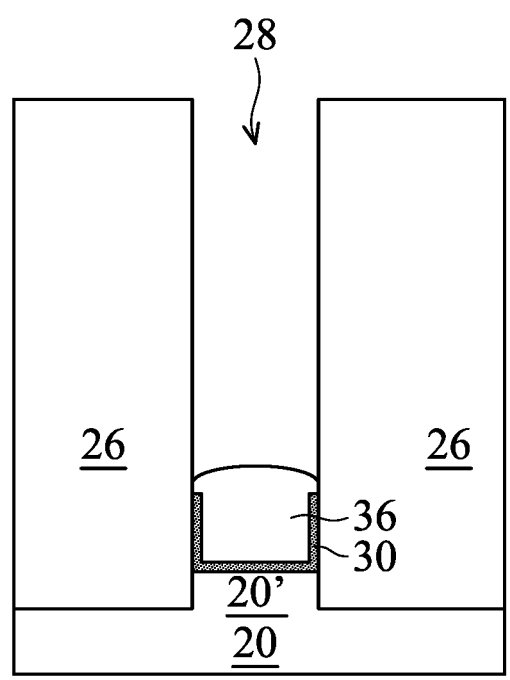

After the etching of the upper portions of semiconductor seed layer 30, protection layer 32 is removed, for example, in an isotropic etching process (dry or wet), depending on the material of protection layer 32. The respective process step is illustrated as step 214 in the process flow 200 as shown in FIG. 24. The resulting structure is shown in FIG. 9, in which the remaining seed layer 30 has a shape of a basin, which includes a bottom portion and sidewall portions. The remaining height H3 may be thinner than (W2)/2 to prevent Ge-growth-induced sidewall merge in the subsequent bottom-up growth of semiconductor region 36 (as shown in FIG. 10). The remaining height H3 of semiconductor seed layer 30 may be in the range between about 3 nm and about 10 nm. The recessing depth (H2-H3) of semiconductor seed layer 30 may be greater than about 10 nm, and may be in the range between about 10 nm and about 107 nm. The ratio of H3/H2 may be in the range between about 2 and about 33.

FIG. 10 illustrates the selective epitaxy of semiconductor region 36. The respective process step is illustrated as step 216 in the process flow 200 as shown in FIG. 24. Epitaxy region 36 may be a silicon germanium region in accordance with some embodiments of the present disclosure. For example, the germanium atomic percentage may be any value in the range between (and including) 0 percent and 100 percent. In accordance with alternative embodiments of the present disclosure, epitaxy region 36 is a germanium region with no silicon therein. Epitaxy region 36 may also be formed of other semiconductor material such as silicon carbon or a III-V compound semiconductor.

Depending on whether epitaxy region 36 is a silicon region, silicon germanium region, or germanium region, the respective process gas may include silane (SiH$_4$), germane (GeH$_4$), or the mixture of silane and germane. Also, an etching gas such as hydrogen chloride (HCl) may be added into the process gas to achieve selective growth, so that epitaxy region 36 is grown from semiconductor seed layer 30, and not from the exposed surfaces of STI regions 26. In accordance with some embodiments of the present disclosure, an n-type impurity-containing process gas (such as a phosphorous-containing process gas) or a p-type impurity containing process gas (such as a boron-containing process gas) is included in the precursor, so that epitaxy region 36 is in-situ doped to the same conductivity type as the well region. In accordance with alternative embodiments of the present disclosure, no n-type impurity containing process gas and p-type impurity containing process gas is included in the process gas for forming epitaxy region 36.

The top surface of epitaxy region 36 may have various shapes, and may be a rounded top surface, a faceted top surface, or have another shape. The top surface of epitaxy region 36 may have convex shape or a concave shape (refer to FIGS. 23C and 23D). For example, FIG. 23C illustrates that the top surface of epitaxy region 36 has a convex shape that includes facets. FIG. 23D illustrates that the top surface of epitaxy region 36 has a concave shape, also including facets. The facets may be straight, and includes horizontal facets and tilted facets. The different shapes of the top surfaces of epitaxy region 36 are the results of different process conditions, different duration of the epitaxy, or the like.

Through the process steps shown in FIGS. 5 through 10, trench 28 is partially filled in a bottom-up style. Comparing FIG. 4 and FIG. 10, it is noted that the trench 28 as shown in FIG. 10 has a reduced aspect ratio than the trench 28 shown in FIG. 4. Reducing the aspect ratio of recess may reduce the likelihood of incurring void in the subsequent gap-filling of trench 28.

Figure 11:
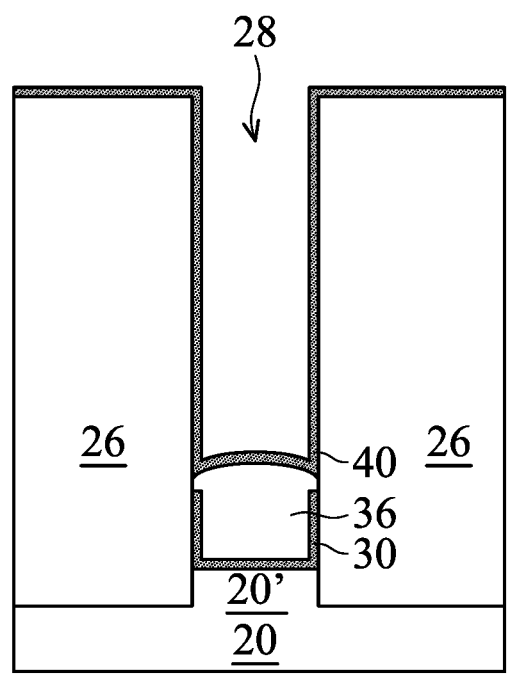

FIGS. 11 through 15 illustrate the further partial filling of trench 28 in accordance with some embodiments of the present disclosure. The process steps are represented by looping the process back to step 206 in the process flow shown in FIG. 24. Steps 206, 208, 210, 212, 214, and 216 as shown in FIG. 24 are repeated. Referring to FIG. 11, semiconductor seed layer 40 is deposited. The temperature for the deposition is selected, so that the portion of seed layer 40 directly deposited on the exposed surface of semiconductor region 36 is epitaxially grown. The material of semiconductor seed layer 40 may be selected from the same group of candidate materials for forming semiconductor seed layer 30. Furthermore, the formation method of semiconductor seed layer 40 may be selected from the same group of candidate methods for forming semiconductor seed layer 30. In accordance with some embodiments of the present disclosure, semiconductor seed layer 40 and semiconductor seed layer 30 are formed of the same material and have the same composition. In accordance with alternative embodiments of the present disclosure, semiconductor seed layer 40 and semiconductor seed layer 30 have different compositions. Throughout the description, when two layers are referred to as having the same composition, it means that the two layers have same types of elements, and the percentages of the elements in two layers are the same as each other. Conversely, when two layers are referred to as having different compositions, it means that one of the two layers either has at least one element not in the other layer, or the two layers have the same elements, but the percentages of the elements in two layers are different from each other. For example, semiconductor seed layer 30 may be formed of silicon or silicon germanium, while semiconductor seed layer 40 may be formed of silicon or silicon germanium, with the germanium percentage in semiconductor seed layer 40 being equal to or higher than the germanium percentage in semiconductor seed layer 30.

The deposition of semiconductor seed layer 40 is also nonselective, and hence semiconductor seed layer 40 is formed on both semiconductor region 36 and STI regions 26. Semiconductor seed layer 40 is formed as a conformal layer, with a thickness in the range between about 1 nm and about 5 nm, for example.

Figure 12:
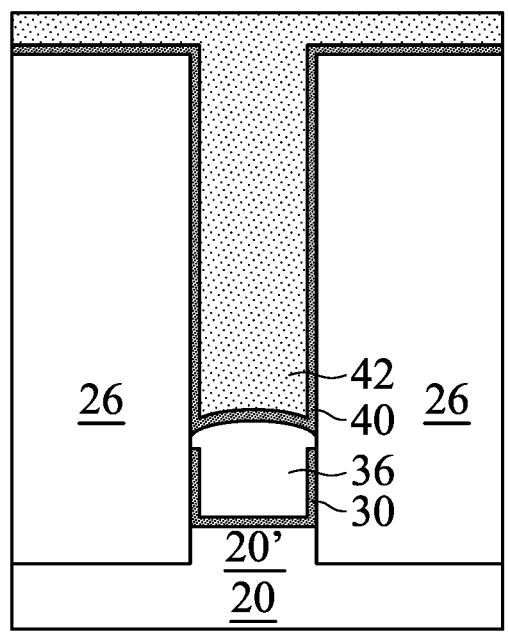

After the deposition of semiconductor seed layer 40, protection layer 42 is formed to fill the remaining portion of trench 28 (FIG. 11). The resulting structure is shown in FIG. 12. In accordance with some embodiments of the present disclosure, protection layer 42 is formed of a material selected from the same candidate material for forming protection layer 32, which may be a photo resist, an inorganic material, or an organic material. The property of protection layer 42 is different from that of STI regions 26, so that in the subsequent etching of semiconductor seed layer 40, STI regions 26 are not damaged. The top surface of protection layer 42 is made substantially planar, which may be achieved by spin coating and/or planarization. The top surface of the resulting protection layer 42 may be higher than, lower than, or level with the top surface of STI regions 26, and may be higher than, lower than, or level with the top surface of seed layer 40.

Figure 13:
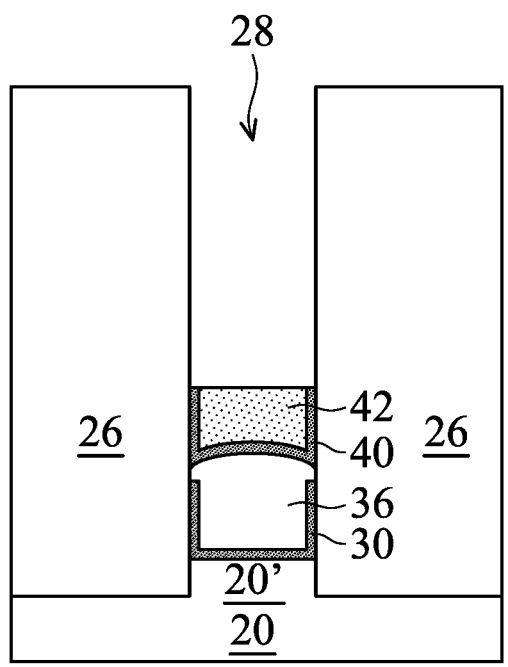

FIG. 13 illustrates the etch-back of protection layer 42 and semiconductor seed layer 40. The resulting process steps may include etching protection layer 42 first, followed by the etching of semiconductor seed layer 40. Alternatively, protection layer 42 and semiconductor seed layer 40 are etched simultaneously in a common process. The etching process may be similar to what is used in the etching of protection layer 32 and semiconductor seed layer 30, as discussed referring to FIGS. 7 and 8.

Figure 14:
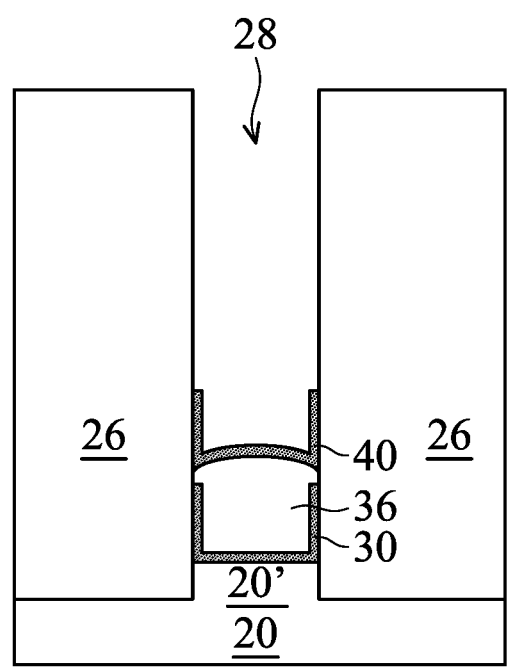

After the removal of semiconductor seed layer 40, protection layer 42 is removed, for example, in an isotropic etching process, depending on the material of protection layer 42. The removal of protection layer 52 may be achieved through dry etch or wet etch. The resulting structure is shown in FIG. 14.

Figure 15:
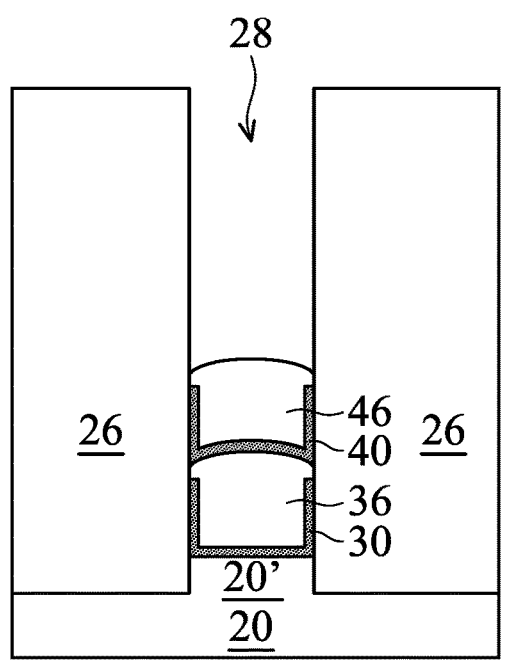
Figure 16:
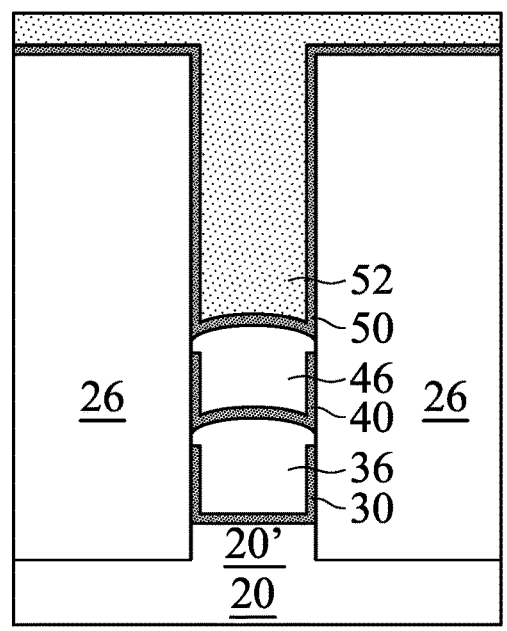
Figure 17:
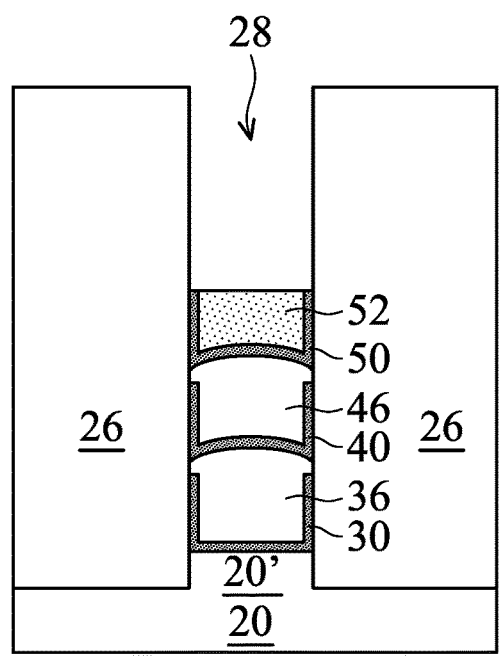
Figure 18:
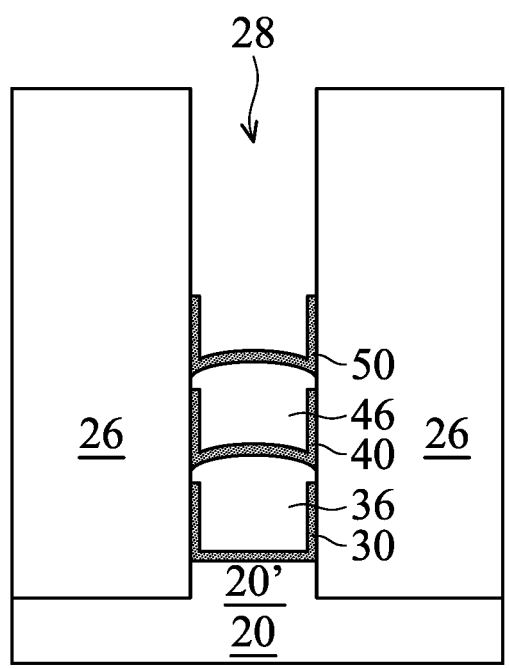
Figure 19:
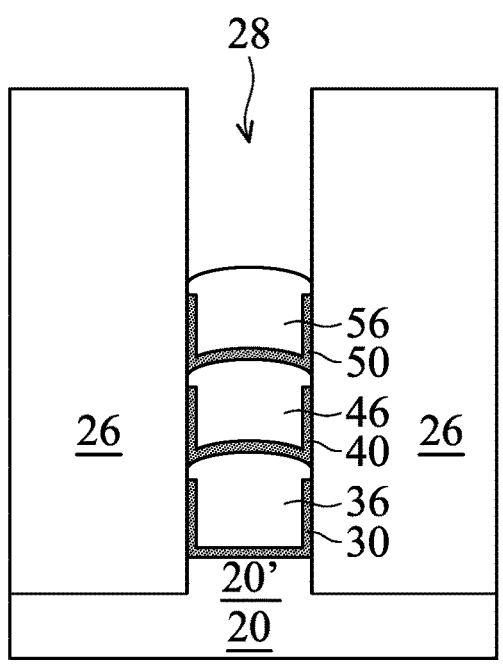

FIG. 15 illustrates the selective epitaxy of semiconductor region 46. Epitaxy region 46 may be a silicon germanium region. The germanium atomic percentage may be any value in the range between (and including) 0 percent and 100 percent in accordance with some embodiments. In accordance with alternative embodiments of the present disclosure, epitaxy region 46 is a germanium region with no silicon therein.

Depending on whether epitaxy region 46 is a silicon region, silicon germanium region, or germanium region, the process gas may include silane, germane, or the mixture of silane and germane. The formation process may be similar to the formation of epitaxy region 36, and hence is not repeated herein. In accordance with some embodiments, epitaxy region 46 has a same composition as epitaxy region 36. In accordance with alternative embodiments, epitaxy region 46 has a composition different from that of epitaxy region 36. For example, both epitaxy regions 36 and 46 may be formed of silicon germanium, and epitaxy region 46 may have a germanium percentage higher than the germanium percentage of epitaxy region 36.

Through the process steps shown in FIGS. 11 through 15, the aspect ratio of trench 28 is further reduced to be than that of the trench 28 as shown in FIG. 10. In accordance with some embodiments of the present disclosure, the process as shown in FIGS. 11 through 15 may be repeated to form more seed layers and epitaxy regions over epitaxy region 46 to further fill trench 28 in a bottom-up style, and the aspect ratio of trench 28 is further reduced. The corresponding process is achieved by repeating steps 206, 208, 210, 212, 214, and 216 as shown in FIG. 24. For example, FIGS. 16, 17, 18, and 19 illustrate the process for forming semiconductor seed layer 50 and epitaxy regions 56, in which protection layer 52 is used to define the height of seed layer 50. The process details are similar to what are discussed referring to FIGS. 11 through 15, and the details are not repeated herein.

Semiconductor seed layer 50 may be formed of a same material as, or a different material than, that of semiconductor seed layers 30 and 40. For example, semiconductor seed layer 50 may be formed of silicon or silicon germanium. When formed of silicon germanium, the germanium percentage of semiconductor seed layer 50 may be equal to or greater than the germanium percentages of semiconductor seed layers 40 and 30. Epitaxy region 56 also may be formed of a same material as, or a different material than, that of epitaxy regions 36 and 46. For example, epitaxy region 56 may be formed of silicon germanium or germanium without silicon. When formed of silicon germanium, the germanium percentage of epitaxy region 56 may be equal to or greater than the germanium percentages of epitaxy regions 36 and 46.

Figure 20:
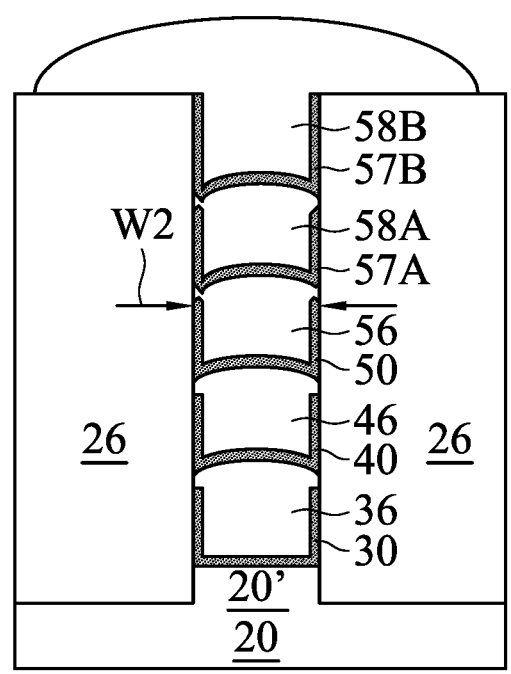

FIG. 20 schematically illustrates the deposition and the etch-back of more semiconductor seed layers and semiconductor regions. The semiconductor seed layers are shown as layers 57 (including layers 57A and 57B, while more or fewer may be formed). The semiconductor regions are shown as layers 58 (including layers 58A and 58B, while more or fewer may be formed). The details of the materials and the formation process may be found from the candidate materials and the formation processes for forming the underlying semiconductor seed layers 30, 40, and 50 and semiconductor regions 36, 46, and 56. In accordance with some embodiments of the present disclosure, the height of each of the seed layers 57 (and also 30, 40, and 50) may also be smaller than a half of width W2 of the respective trench to prevent the merge of the portions of semiconductor regions grown from the opposite sidewall portions of the respective seed layers. It is appreciated that the total count of all seed layers may be any number equal to or higher than two, although five seed layers are illustrated as an example.

Figure 21:
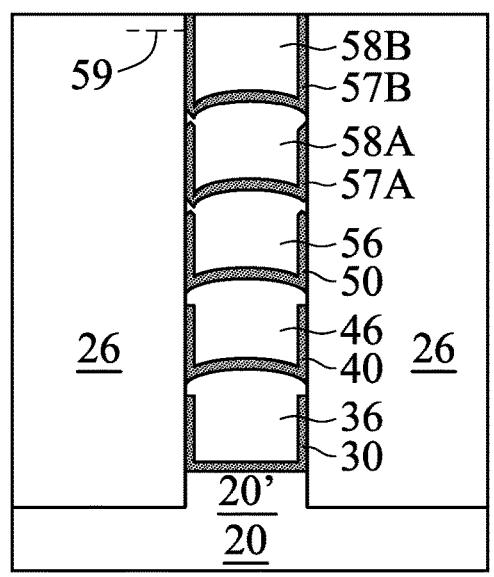

FIG. 21 illustrates the planarization (such as CMP or mechanical grinding) of semiconductor region 58B, so that the top surface of top semiconductor region 58B is coplanar with the top surfaces of STI regions 26. Also, after the planarization, the top edge of the top seed layer 57B may be level with (as illustrated) or lower than the top surface of the respective semiconductor region 58B, and dashed line 59 schematically illustrates the level of the top edges of seed layer 57B in accordance with some embodiments.

In accordance with some embodiments of the present disclosure, epitaxy regions 58 are formed of silicon germanium, germanium, or other applicable semiconductor materials. Furthermore, when formed of silicon germanium, the germanium percentage of epitaxy regions 58A and 58B may be equal to or higher than any one of the germanium percentage in seed layers 30 and 40 and epitaxy regions 36, 46, and 56. For example, the germanium percentage in epitaxy region 58A and 58B may be in the range between, and including, about 30 percent and about 100 percent. The formation of epitaxy region 58 may be in-situ with the formation of epitaxy region 56, with no vacuum break there between.

It is appreciated that in the above-discussed embodiments, the epitaxy regions 36, 46, and 56, and seed layers 30, 40, and 50 are referred to as including silicon and/or germanium as an example, the epitaxy regions may also be formed of other applicable semiconductor materials such as silicon, silicon carbon, III-V compound semiconductor materials, or the like.

Figure 22:
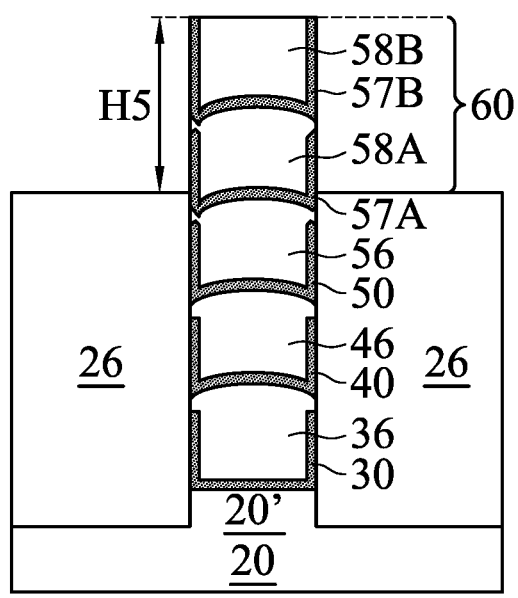

Next, STI regions 26 as shown in FIG. 21 are recessed to form semiconductor fin 60, as illustrated in FIG. 22. The respective process step is illustrated as step 218 in the process flow 200 as shown in FIG. 24. The recessing of STI regions 26 may be performed using a dry etch process or a wet etch process. In accordance with some embodiments of the present disclosure, the recessing of STI regions 26 is performed using a dry etch method, in which the process gases include NH$_3$ and HF. In accordance with alternative embodiments of the present disclosure, the recessing of STI regions 26 is performed using a wet etch method, in which the etchant solution is a dilution HF solution, which may have an HF concentration lower than about 1 percent.

The protruding portion of epitaxy regions and the respective seed layers, which protrudes higher than the top surfaces of the remaining STI regions 26, is referred to as semiconductor fin 60 hereinafter. The height H5 of semiconductor fin 60 may be in the range between about 10 percent and about 50 percent of height H1 (FIG. 2) of the original substrate portion 20'.

After STI regions 26 are recessed to form semiconductor fin 60, a plurality of process steps is performed on semiconductor fin 60, which process steps may include well implantations, gate stack formation, a plurality of cleaning steps, and the like. A FinFET is thus formed. An exemplary FinFET 62 is illustrated in FIG. 23A, which also shows the formation of gate stack 68. Gate stack 68 includes gate dielectric 64 on the top surfaces and sidewalls of fin 60, and gate electrode 66 over gate dielectric 64. The respective process step is illustrated as step 220 in the process flow 200 as shown in FIG. 24. Gate dielectric 64 may be formed through a thermal oxidation process, and hence may include thermal silicon oxide. The formation of gate dielectric 64 may also include a deposition step, and the resulting gate dielectric 64 may include a high-k dielectric material or a non-high-k dielectric material. Gate electrode 66 is then formed on gate dielectric 64. Gate dielectric 64 and gate electrode 66 may be formed using a gate-first approach or a gate-last approach.

Figure 24A:
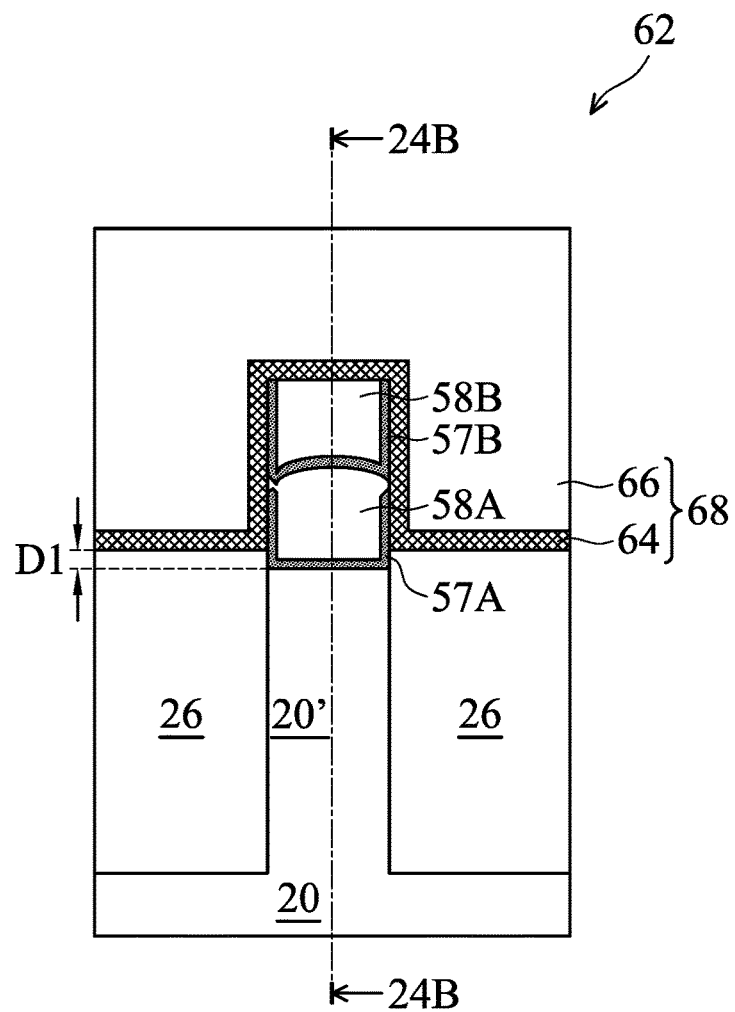

FIG. 24A illustrates FinFET 62 In accordance with some embodiments of the present disclosure. In these embodiments, bottom seed layer 57A extends slightly lower than the top surfaces of STI regions 26. The portions of strip 20' underlying bottom seed layer 57A is a part of the original substrate 20. There may not be any seed layer that is entirely lower than the top surfaces of STI regions 26. Depth D1, which is the depth of seed layer 57A extending below the top surfaces of STI regions 26, may be greater than about 5 nm.

Figure 23B:
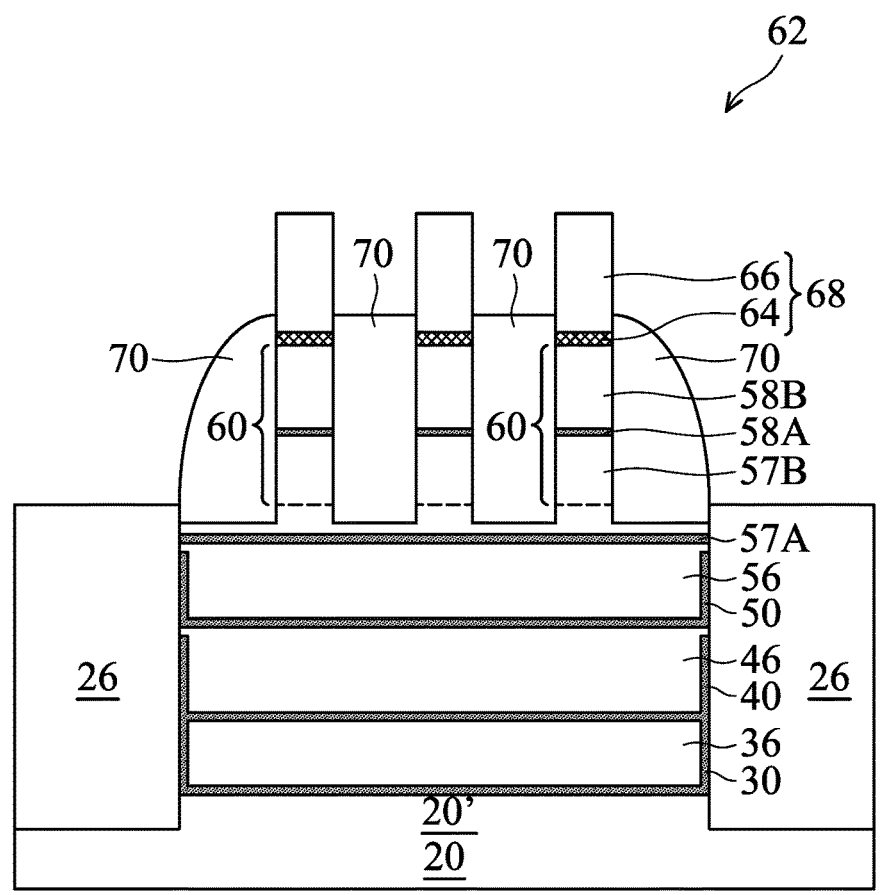
FIGS. 23B, 23C, 23D, 24A and 24B illustrate the cross-sectional views of FinFETs in accordance with some embodiments.
Figure 23C:
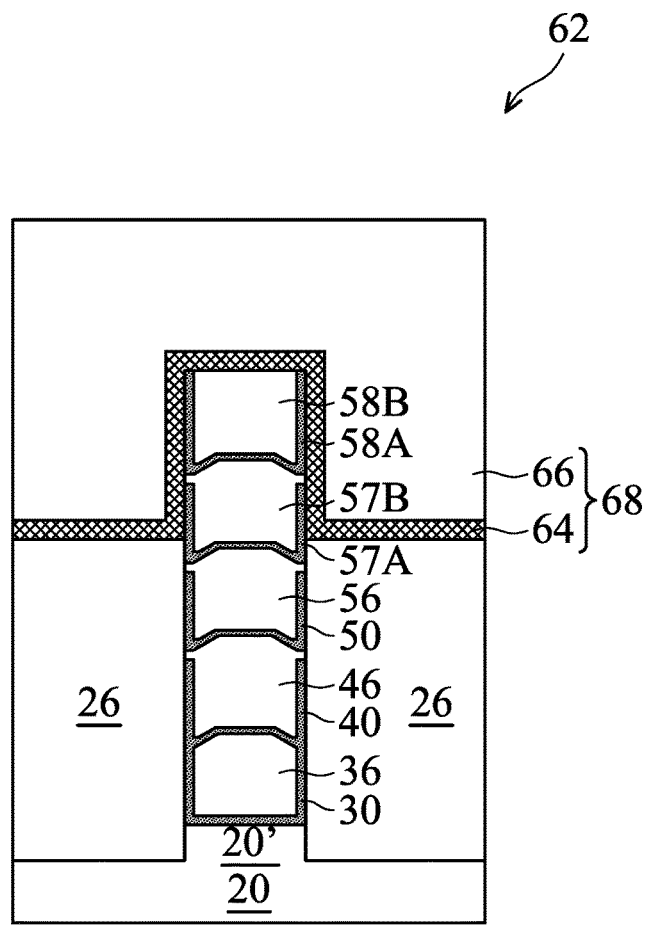
Figure 23D:
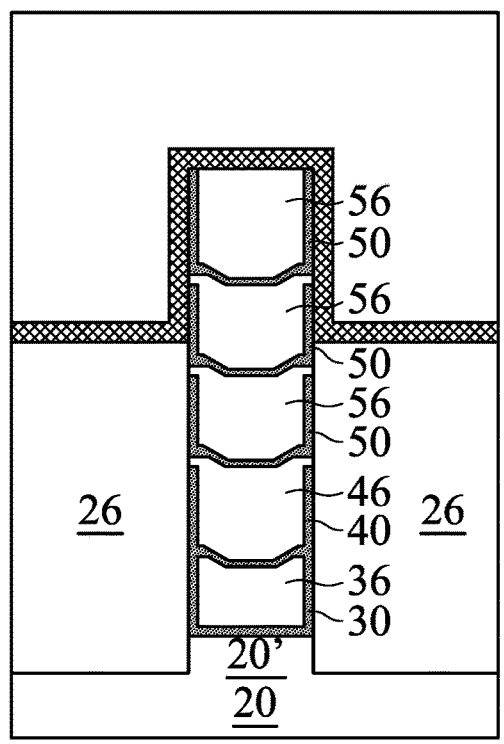

FIG. 23B illustrates a cross-sectional view of FinFET 62, wherein the cross-sectional view is obtained from the plane containing line 23B-23B in FIG. 23A. As shown in FIG. 23B, a plurality of gate stacks 68 is formed on semiconductor fin 60, and source and drain regions 70 are formed between gate stacks 68. The respective process step is illustrated as step 222 in the process flow 200 as shown in FIG. 24. Source and drain regions 70 may be formed by etching the portions of the semiconductor fin 60 between gate stacks 68, and epitaxially growing another semiconductor material such as silicon phosphorus, silicon carbon phosphorus, silicon germanium boron, germanium boron, III-V compound semiconductor, or other applicable materials. The remaining portions of semiconductor fin 60 are separated from each other by common source regions and common drain regions 70. The gate stacks 68 may be interconnected, the source regions 70 may be interconnected, and the drain regions 70 may be interconnected to form FinFET 62.

As also shown in FIG. 23B, semiconductor seed layers 30, 40, 50, 57A and 57B and epitaxy regions 36, 46, 56, 58A, and 58B in combination may continuously extend below a plurality of gate stacks 68 and a plurality of source and drain regions 70. The composite structure including the alternating seed layers and epitaxy semiconductor regions may be distinguishable (for example, through Transmission Electron Microscopy (TEM), Scanning Electron Microscopy (SEM), Secondary Ion Mass Spectrometry (SIMS) or the like) when there is enough difference in the compositions of these layers and regions. Alternatively, the composite structure including the alternating seed layers and epitaxy semiconductor regions may not be distinguishable if there is no enough difference in the compositions of these layers and regions, and/or the differences are reduced by the annealing process.

Figure 24B:
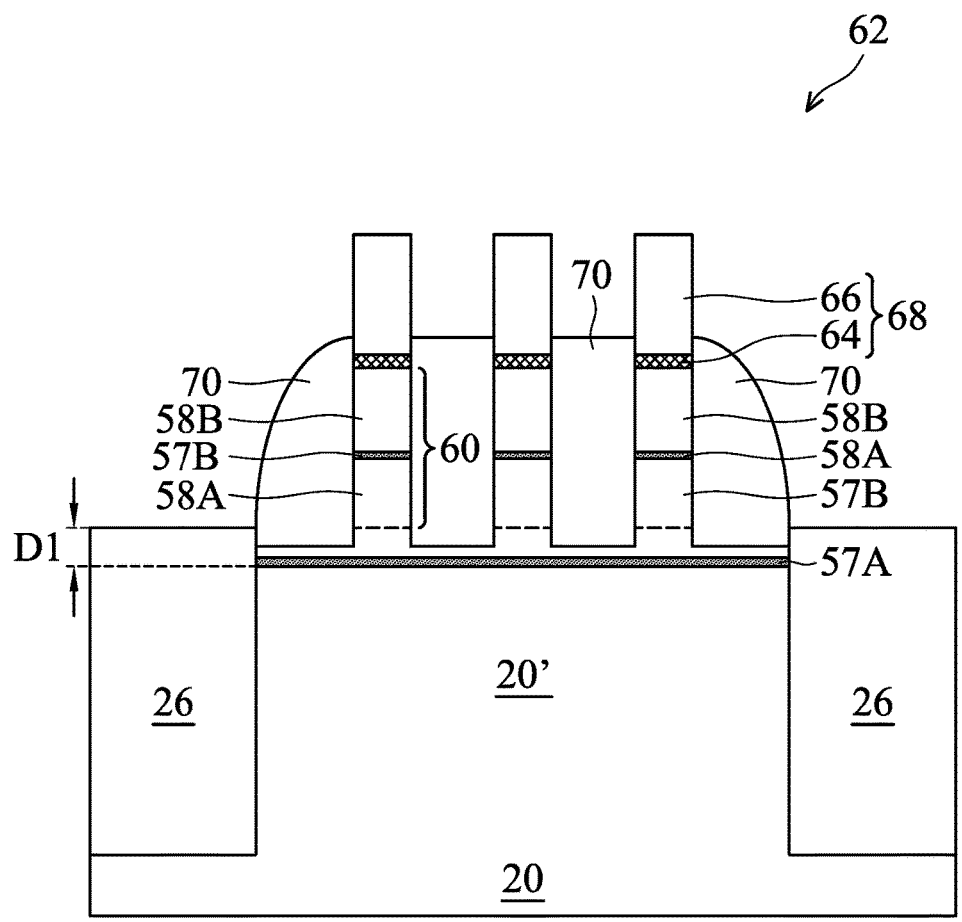
Figure 25:
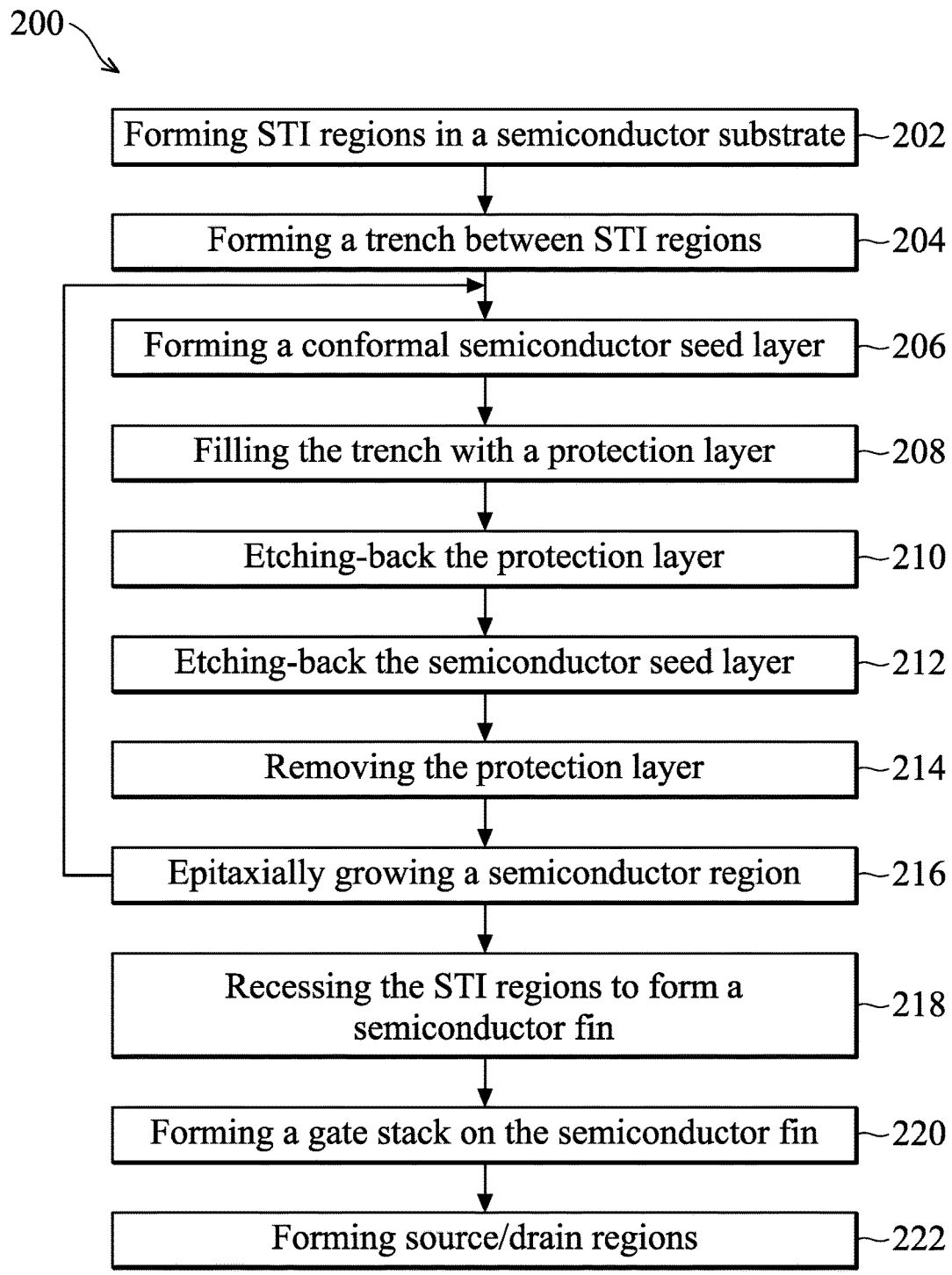
FIG. 25 illustrates a process flow for gap-filling and the formation of a FinFET in accordance with some embodiments.

FIG. 24B illustrates a cross-sectional view of FinFET 62 in accordance with some embodiments of the present disclosure. The cross-sectional view is obtained from the plane containing 24B-24B in FIG. 24A. Seed layer 57A is a bottom seed layer in accordance with some embodiments.

FIGS. 23A and 23B also illustrated some examples in which the upper semiconductor seed layer may be, or may not be merged with the lower semiconductor seed layer. For example, seed layer 40 is illustrated as being in contact with seed layer 30 as an example, and seed layer 50 is illustrated as being spaced apart from seed layer 40 by a portion of epitaxy region 46 as another example. It is noted that these are merely examples, and whether a seed layer contacts the underlying seed layer depends on the process such as how long the epitaxy regions 36 and 46 are grown.

The embodiments of the present disclosure have some advantageous features. By forming a semiconductor seed layer at the bottom of a trench and performing selective epitaxy, the trench is filled bottom-up. When the bottom portion of the trench is partially filled, the aspect ratio of the trench is reduced, and the remaining trench can be filled without generating voids.

In accordance with some embodiments of the present disclosure, a method includes etching a portion of a semiconductor material between isolation regions to form a trench, forming a semiconductor seed layer extending on a bottom surface and sidewalls of the trench, etching-back the first semiconductor seed layer until a top surface of the semiconductor seed layer is lower than top surfaces of the isolation regions, performing a selective epitaxy to grow a semiconductor region from the semiconductor seed layer, and forming an additional semiconductor region over the semiconductor region to fill the trench. In an embodiment, the etching-back the first semiconductor seed layer comprises: forming a protection layer over the first semiconductor seed layer; etching-back the protection layer, wherein the etching-back the first semiconductor seed layer is performed using the protection layer as an etching mask; and before the first semiconductor seed layer is grown, removing the protection layer. In an embodiment, the forming the protection layer comprises dispensing a photo resist. In an embodiment, the first semiconductor seed layer comprises horizontal portions and vertical portions having thicknesses close to each other. In an embodiment, after the first semiconductor seed layer is etched back, the first semiconductor seed layer has a basin shape. In an embodiment, the forming the first semiconductor seed layer is nonselective, and the first semiconductor seed layer is grown from both surfaces of the isolation regions and a top surface of the semiconductor material. In an embodiment, the forming the first semiconductor seed layer comprises growing a silicon layer, with the silicon layer free from germanium. In an embodiment, the forming the first semiconductor seed layer comprises growing a silicon germanium layer. In an embodiment, the method further includes forming a second semiconductor seed layer over the first semiconductor region, wherein the second semiconductor seed layer comprises a first portion on top surfaces of the isolation regions, and a second portion extending into the trench; etching-back the second semiconductor seed layer; and performing a second selective epitaxy to grow a second semiconductor region from the second semiconductor seed layer, wherein the additional semiconductor region is formed over the second semiconductor region.

In accordance with some embodiments of the present disclosure, a method includes forming isolation regions extending into a semiconductor substrate; etching a portion of the semiconductor substrate between the isolation regions to form a trench; and performing a plurality of loops, each including growing a semiconductor seed layer comprising a first portion in the trench, and a second portion outside of the trench; filling a protection layer into the trench; etching back the protection layer, so that the protection layer has a top surface lower than top surfaces of the isolation regions; etching portions of the semiconductor seed layer; removing the protection layer; and growing an epitaxy region from the semiconductor seed layer. In an embodiment, the semiconductor seed layer is formed using atomic layer deposition. In an embodiment, the semiconductor seed layer is formed using chemical vapor deposition. In an embodiment, the method further includes growing an additional semiconductor region to fully fill the trench; performing a planarization on the additional semiconductor region; and recessing the isolation regions so that a top portion of the additional semiconductor region forms a semiconductor fin. In an embodiment, the growing the semiconductor seed layer comprises growing a silicon layer. In an embodiment, the growing the semiconductor seed layer comprises growing a silicon germanium layer.

In accordance with some embodiments of the present disclosure, a device includes a semiconductor substrate; isolation regions extending into the semiconductor substrate; a first semiconductor seed layer between isolation regions, the first semiconductor seed layer including a first portion on a top surface of a portion of the semiconductor substrate; and a second portion and a third portion on sidewalls of the isolation regions, wherein top surface of the second portion and the third portion are lower than top surfaces of the isolation regions; and a first semiconductor region between the second portion and the third portion of the first semiconductor seed layer, wherein the first semiconductor seed layer and the first semiconductor region have different compositions. In an embodiment, the device further includes a second semiconductor region between the isolation regions, with the second semiconductor region being over the first semiconductor region, and the first semiconductor region and the second semiconductor region have different compositions. In an embodiment, a portion of the second semiconductor region is higher than top surfaces of the isolation regions to form a semiconductor fin, and the device further comprises a gate stack on the semiconductor fin. In an embodiment, the first semiconductor seed layer comprises silicon, and is free from germanium therein. In an embodiment, the first semiconductor seed layer comprises silicon germanium.

In accordance with some embodiments of the present disclosure, a method includes forming isolation regions extending into a semiconductor substrate; etching a portion of the semiconductor substrate between the isolation regions to form a trench; forming a semiconductor seed layer comprising a first portion extending into the trench, and a second portion outside of the trench; filling the trench with a protection layer, with the protection layer being on a bottom portion of the semiconductor seed layer; etching back the semiconductor seed layer and the protection layer, with top surfaces of remaining portions of the semiconductor seed layer and the protection layer being lower than top surfaces of the isolation region; and removing the protection layer. In an embodiment, the semiconductor seed layer is etched after the protection layer is etched, and the semiconductor seed layer is etched using a remaining portion of the protection layer as an etching mask. In an embodiment, the semiconductor seed layer and the protection layer are etched in a common process. In an embodiment, the method further includes selectively growing a semiconductor region in a space left by the removed protection layer. In an embodiment, the semiconductor seed layer and the semiconductor region are formed of different semiconductor materials.

In accordance with some embodiments of the present disclosure, a device includes a semiconductor substrate; isolation regions extending into the semiconductor substrate; and a plurality of semiconductor regions between the isolation regions, with an upper one of the plurality of semiconductor regions being overlapping a respective lower one of the plurality of semiconductor regions, wherein each of the plurality of semiconductor regions comprises: a seed layer; and an epitaxy semiconductor region over a bottom portion of the seed layer, wherein the seed layer and the epitaxy semiconductor region are formed of different semiconductor materials. In an embodiment, the seed layer comprises: a bottom portion; and sidewall portions over, and connected to opposite end portions of, the bottom portion of the seed layer, wherein the epitaxy semiconductor region is between the sidewall portions of the seed layer. In an embodiment, the seed layer is formed of silicon, and the epitaxy semiconductor region is formed of silicon germanium.

In accordance with some embodiments of the present disclosure, a device includes a semiconductor substrate; isolation regions extending into the semiconductor substrate; and a semiconductor region between opposite portions of the isolation regions, the semiconductor region including a seed layer including a bottom portion; and sidewall portions contacting sidewalls of the isolation regions, wherein the bottom portion and the sidewall portions form a basin; and an epitaxy semiconductor region in the basin, wherein the epitaxy semiconductor region and the seed layer are formed of different semiconductor materials. In an embodiment, the device further includes an additional semiconductor region over the semiconductor region, wherein the additional semiconductor region includes a lower portion between the opposite portions of the isolation regions; and an upper portion protruding higher than top surfaces of the isolation regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit device comprising:
a semiconductor substrate;
isolation regions adjacent to a surface of the semiconductor substrate;
a first semiconductor seed layer between isolation regions, the first semiconductor seed layer comprising:
 a first portion on a top surface of a portion of the semiconductor substrate; and
 a second portion and a third portion on sidewalls of the isolation regions and connecting to the first portion, wherein top surfaces of the second portion and the third portion are lower than top surfaces of the isolation regions; and
a first semiconductor region between the second portion and the third portion of the first semiconductor seed layer, wherein the first semiconductor seed layer and the first semiconductor region have different compositions.

2. The integrated circuit device of claim 1 further comprising:
a second seed layer overlapping the first semiconductor region and the first semiconductor seed layer; and
a second semiconductor region over and contacting the second seed layer.

3. The integrated circuit device of claim 2, wherein a portion of the second seed layer and a portion of the second semiconductor region are higher than top surfaces of the isolation regions to form a semiconductor fin.

4. The integrated circuit device of claim 2, wherein an entirety of the second seed layer and an entirety of the second semiconductor region in combination form a part of a semiconductor fin protruding higher than the isolation regions, and the integrated circuit device further comprising:
a gate stack on a top surface and sidewalls of the semiconductor fin.

5. The integrated circuit device of claim 4 further comprising:
a source region and a drain region on opposite sides of the gate stack, wherein the second seed layer and the second semiconductor region extend from the source region to the drain region.

6. The integrated circuit device of claim 1, wherein the first semiconductor seed layer comprises silicon, and is free from germanium therein.

7. The integrated circuit device of claim 1, wherein the first semiconductor seed layer comprises silicon germanium.

8. The integrated circuit device of claim 1, wherein the first semiconductor region has a top surface higher than a top edge of the second portion of the first semiconductor seed layer.

9. An integrated circuit device comprising:
a semiconductor substrate;
isolation regions extending into the semiconductor substrate; and
a plurality of semiconductor regions between the isolation regions, with an upper one of the plurality of semiconductor regions being overlapping a respective lower one of the plurality of semiconductor regions, wherein each of the plurality of semiconductor regions comprises:
 a seed layer; and
 an epitaxy semiconductor region over a bottom portion of the seed layer, wherein the seed layer and the epitaxy semiconductor region are formed of different semiconductor materials.

10. The integrated circuit device of claim 9, wherein the seed layer comprises:
a bottom portion; and
sidewall portions over, and connected to opposite ends of, the bottom portion of the seed layer, wherein the epitaxy semiconductor region is between the sidewall portions of the seed layer.

11. The integrated circuit device of claim 9, wherein the seed layer is formed of silicon, and the epitaxy semiconductor region is formed of silicon germanium.

12. The integrated circuit device of claim 9, wherein the seed layer is formed of silicon germanium, and the epitaxy semiconductor region is formed of germanium.

13. The integrated circuit device of claim 9, wherein a top one of the plurality of semiconductor regions is higher than top surfaces of the isolation regions to form a part of a semiconductor fin.

14. The integrated circuit device of claim 13, wherein more than one of the plurality of semiconductor regions are higher than the top surfaces of the isolation regions.

15. The integrated circuit device of claim 13 further comprising a Fin Field-Effect Transistor (FinFET), with a portion of the plurality of semiconductor regions forming a channel region of the FinFET.

16. The integrated circuit device of claim 9, wherein the plurality of semiconductor regions comprises a first semiconductor region and a second semiconductor region over and contacting the first semiconductor region, wherein the seed layer of the second semiconductor region is spaced apart from the seed layer of the first semiconductor region by the epitaxy semiconductor region of the first semiconductor region.

17. An integrated circuit device comprising:
a semiconductor substrate;
isolation regions extending into the semiconductor substrate; and
a semiconductor region between opposite portions of the isolation regions, the semiconductor region comprising:
a seed layer comprising:
a bottom portion; and
sidewall portions contacting sidewalls of the isolation regions, wherein the bottom portion and the sidewall portions form a basin; and
an epitaxy semiconductor region in the basin, wherein the epitaxy semiconductor region and the seed layer are formed of different semiconductor materials.

18. The integrated circuit device of claim 17 further comprising:
an additional semiconductor region over the semiconductor region, wherein the additional semiconductor region comprises:
a lower portion between, and at a same level as, the opposite portions of the isolation regions; and
an upper portion protruding higher than top surfaces of the isolation regions.

19. The integrated circuit device of claim 17, wherein the epitaxy semiconductor region has a higher germanium percentage than the seed layer.

20. The integrated circuit device of claim 17, wherein the seed layer has a higher silicon percentage than the epitaxy semiconductor region.

* * * * *